(12) United States Patent
Bloom

(10) Patent No.: US 7,532,651 B2
(45) Date of Patent: May 12, 2009

(54) ILLUMINATION SYSTEM FOR OPTICAL MODULATORS

(75) Inventor: David M. Bloom, Jackson, WY (US)

(73) Assignee: Alces Technology, Inc., Jackson, WY (US)

( * ) Notice: Subject to any disclaimer, the term of this patent is extended or adjusted under 35 U.S.C. 154(b) by 88 days.

(21) Appl. No.: 11/799,565

(22) Filed: May 2, 2007

(65) Prior Publication Data

US 2008/0273557 A1  Nov. 6, 2008

(51) Int. Cl.
H01S 3/13 (2006.01)
H01S 3/03 (2006.01)
H01S 3/08 (2006.01)

(52) U.S. Cl. .................. 372/29.023; 372/64; 372/101
(58) Field of Classification Search ............ 372/29.023, 372/64, 101; 359/559
See application file for complete search history.

(56) References Cited

U.S. PATENT DOCUMENTS

| 4,764,929 A | 8/1988 | Thaniyavarn |
| 4,813,762 A | 3/1989 | Leger |
| 4,823,353 A * | 4/1989 | Taneya et al. ............ 372/50.12 |
| 4,971,412 A | 11/1990 | Hiiro |
| 5,124,843 A | 6/1992 | Leger |
| 5,237,451 A | 8/1993 | Saxe |
| 5,486,950 A | 1/1996 | Collinge |
| 5,864,430 A * | 1/1999 | Dickey et al. ............... 359/559 |
| 6,526,079 B1 * | 2/2003 | Watterson et al. ............. 372/32 |
| 2007/0153866 A1 * | 7/2007 | Shchegrov et al. ..... 372/50.124 |

OTHER PUBLICATIONS

J. Yang et al., "Analysis and optimization on single-zone binary flat-top beam shaper", Opt. Eng. 42, p. 3106-3113, Nov. 2003, SPIE.

* cited by examiner

Primary Examiner—Armando Rodriguez
(74) Attorney, Agent, or Firm—NUPAT, LLC; Morrison Ulman

(57) ABSTRACT

A phase plate and lens modify light beams emitted by an array of lasers to form an efficient illumination source for a MEMS light modulator array. The phase of the electric field emitted by the lasers is modified such that the after passing through a lens the beam profile at the lens focal plane has an approximately rectangular shape appropriate for illuminating a light modulator array. The phase plate may be constructed from a glass plate with rectangular notches etched in it or with rectangular ridges formed on it. Furthermore a light source, such as a laser, may be coupled to an adiabatically tapered optical waveguide in which a phase adjusting block is introduced in analogy to notches in a bulk phase plate. Phase modified light beams output from the waveguide system have similar focusing properties to those passing through a bulk phase plate.

23 Claims, 14 Drawing Sheets

ILLUMINATION SYSTEM FOR OPTICAL MODULATORS

TECHNICAL FIELD

The disclosure is generally related to light sources for optical displays. In particular it is related to systems and methods for illuminating an optical modulator uniformly with light from a laser array.

BACKGROUND

A projection display system includes a light source and an optical modulator as basic components. The light source supplies light which is manipulated by the modulator to form an image. Light sources of several colors may be used to create color images and the brighter the light source the brighter the image that can be formed.

Laser arrays are promising light sources for display applications. Arrays of high power, extended vertical cavity, surface emitting, diode lasers can be frequency doubled to provide light across the visible spectrum. As an example, Novalux, Inc. (Sunnyvale, Calif.) has demonstrated Novalux Extended Cavity Surface Emitting Lasers (NECSEL) that produce light at red, green and blue wavelengths.

Optical modulators based on linear arrays of micro-electromechanical systems (MEMS) are well suited for display applications. Such modulators manipulate the amplitude and/or phase of incident light to distribute it into patterns that form an image. Uniform illumination of a modulator is usually required to produce an image of uniform brightness.

Laser light beams often have a Gaussian intensity profile in the direction perpendicular to propagation. One way to illuminate a linear modulator array approximately uniformly with a Gaussian beam is to expand the beam so that only the central part strikes the array. Light in the lower intensity "wings" of the Gaussian profile is lost, however. What is needed is a way to efficiently use the light emitted by lasers, especially laser arrays, to uniformly illuminate linear light modulator arrays.

BRIEF DESCRIPTION OF THE DRAWINGS

The drawings are heuristic for clarity.

DETAILED DESCRIPTION

Laser arrays are useful as light sources for projection displays. For example, Novalux NECSEL arrays provide high brightness at red, green and blue wavelengths.

Figure 1:
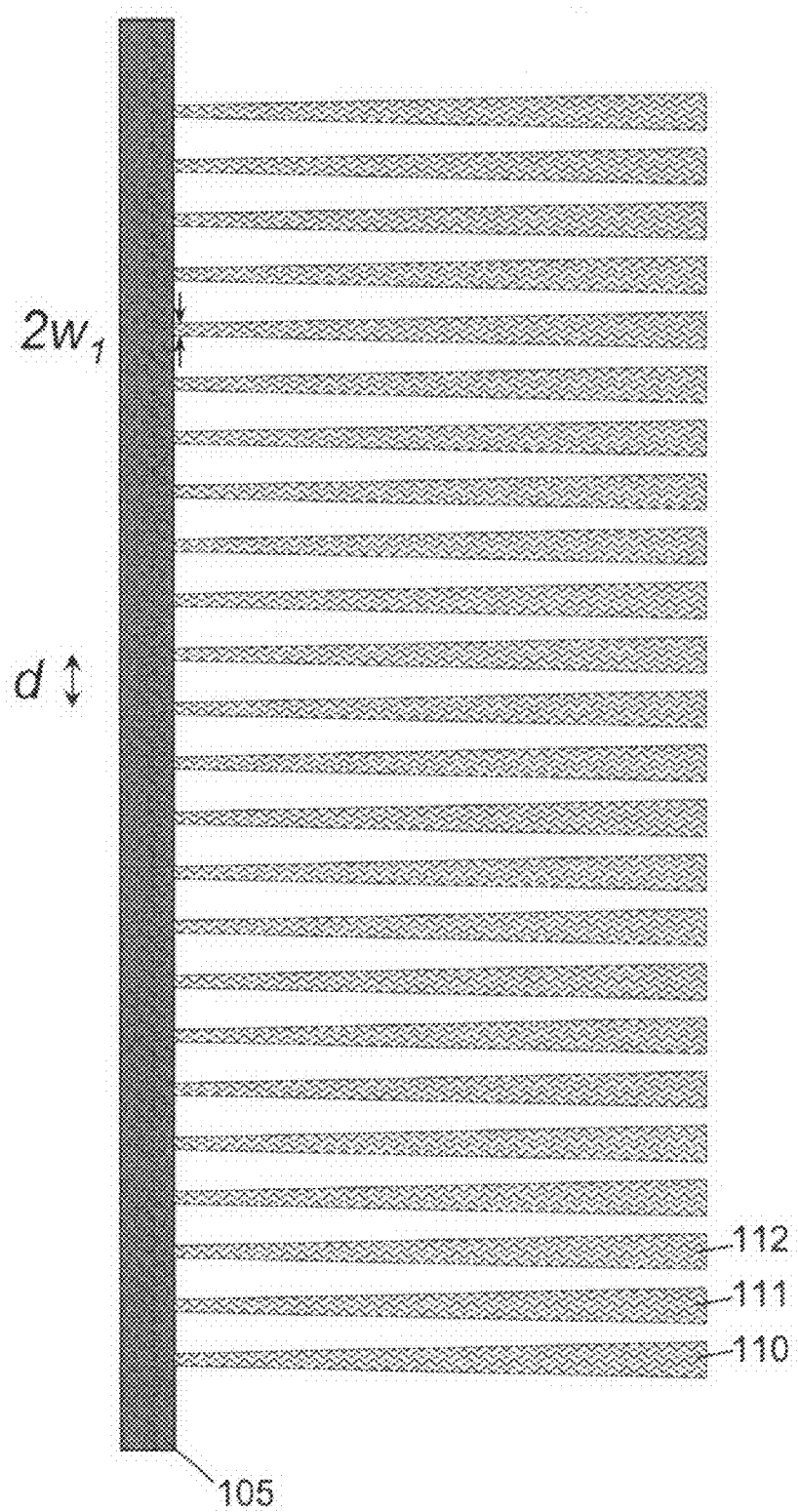
FIG. 1 shows a laser array with light beams propagating away from it.

FIG. 1 shows a laser array with light beams propagating away from it. In the figure, array 105 contains several lasers that radiate light beams such as light beams 110, 111, 112, etc. The lasers may be extended cavity surface emitting diode lasers, for example. The emitters are spaced apart by distance, d, and the $1/e^2$ diameter of each light beam is equal to $2w_1$. In a typical arrangement 24 NECSELs are spaced apart by d~350 microns and each laser emits a Gaussian beam with a diameter of approximately 70 microns. Neither the number of emitters nor the spacing nor the beam diameter is of particular importance here. The light beams diverge as they propagate.

Figure 2:
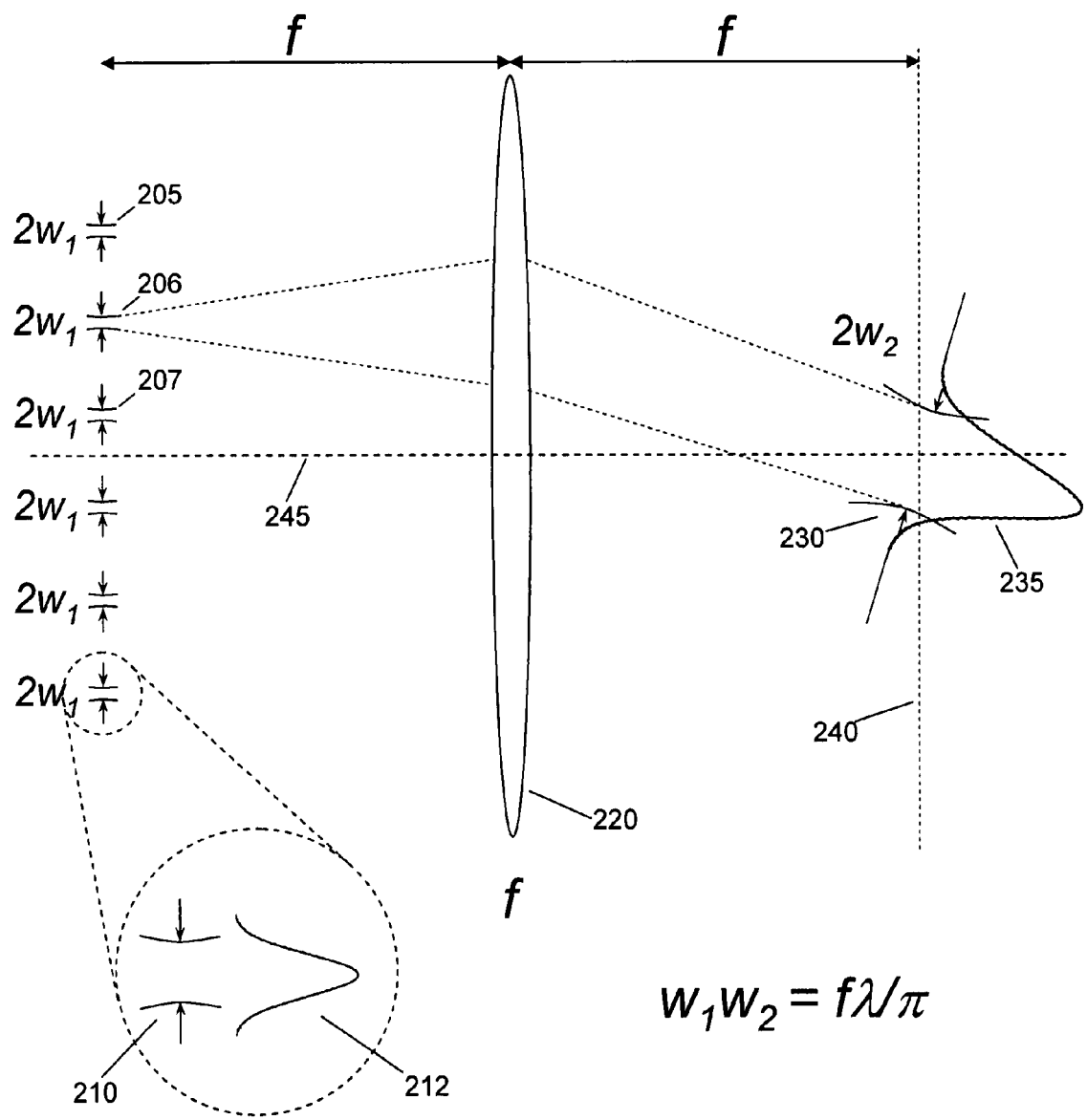
FIG. 2 shows how light from lasers in an array is focused by a lens.

FIG. 2 shows how light from lasers in an array is focused by a lens. In FIG. 2 beam waists of six lasers are shown schematically as 205, 206, 207, etc. An enlarged view shows the waist 210 of a laser as well as its Gaussian intensity profile 212. Note that a beam waist of a laser beam may lie inside the laser cavity. As in FIG. 1, the $1/e^2$ diameter of each light beam is equal to $2w_1$. Lens 220 is placed one focal length, f, away from the plane containing the beam waists of the lasers. Light from each laser is focused at a distance, f, away from lens 220 on the opposite side of the lens from the laser. The light is focused at focal plane 240 in the figure.

Lens 220 causes the Fourier transform of the distribution of light at the laser beam waists to appear at focal plane 240. Since laser waists 205, 206, 207, etc. have Gaussian profiles, light at focal plane 240 also has a Gaussian profile. Furthermore, lateral displacement at the emitter plane corresponds to angular displacement at the focal plane. Light from emitter 205 arrives at focal plane 240 at a larger angle with respect to lens axis 245 than does light from emitter 206 because emitter 205 is laterally displaced farther from lens axis 245 than is emitter 206.

Light at focal plane 240 has a Gaussian profile 235 with beam diameter 230 equal to $2w_2$. The diameters of light beams at the emitter plane and the focal plane are related by: $w_1 w_2 = f\lambda/\pi$. When $w_2 >> w_1$, the beam at focal plane 240 is nearly collimated.

FIG. 2 shows how light from an array of lasers can be combined in a Gaussian beam by a lens. However, a Gaussian beam profile may not be optimum for illuminating an optical modulator. An optical modulator containing a linear array of modulator elements may be better served by an illumination profile that is constant for a specified width from a beam axis.

The beam profile at the focal plane is the Fourier transform of that at the plane containing the laser waists. Therefore a desired illumination profile at the focal plane may be obtained by generating its Fourier transform at the plane containing the laser beam waists. An illumination profile that is constant across the width of a modulator and zero elsewhere is known as a rectangle function. Its Fourier transform is a sinc(x) function.

Figure 3:
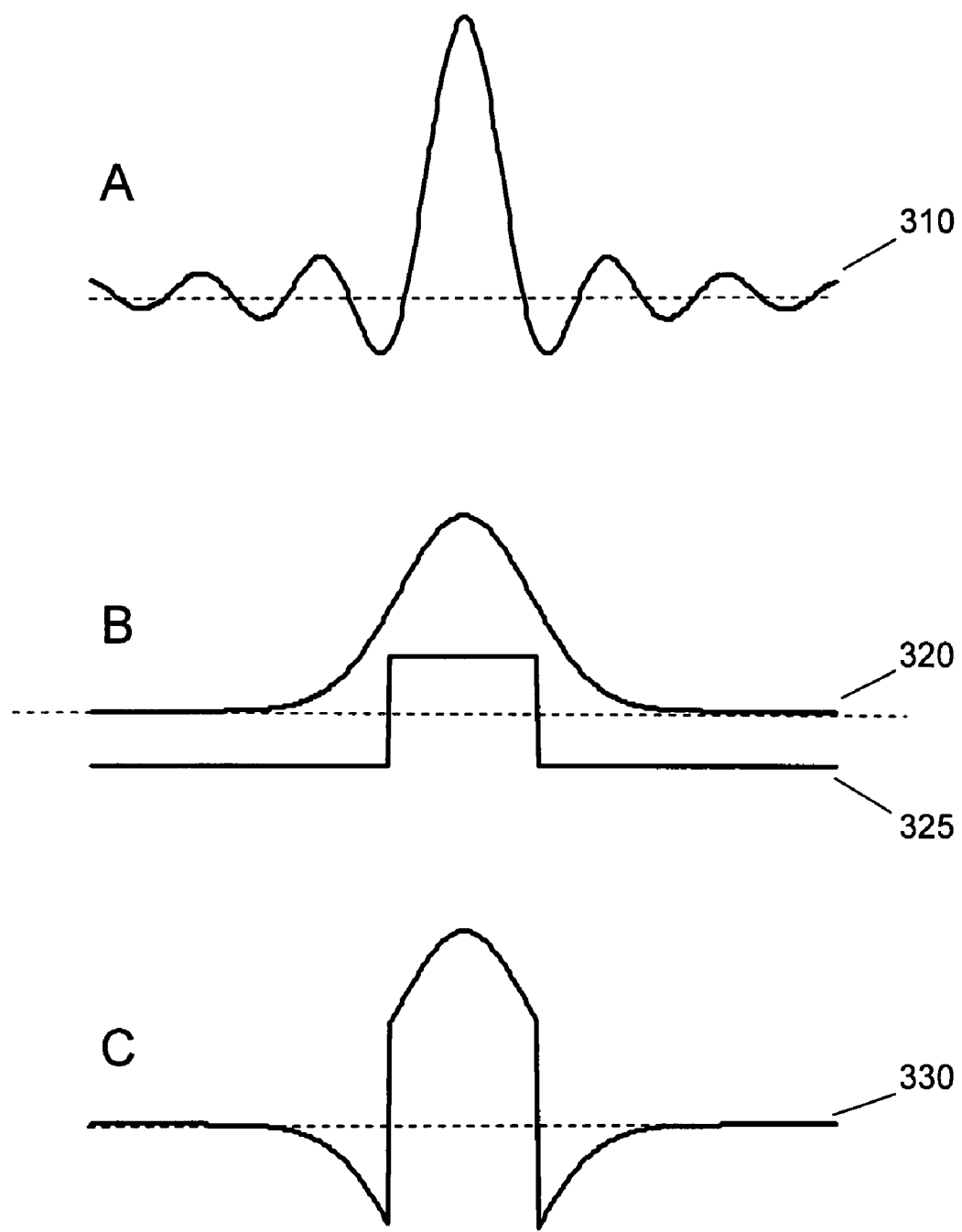
FIGS. 3 A, B and C are graphs of various functions representing light beam electric fields or phases.

FIGS. 3 A, B and C are graphs of various functions representing light beam electric fields or phases. In FIG. 3A, graph 310 is a sinc(x) function; i.e. sin(x)/(x). In FIG. 3B, graph 320 is a Gaussian function and graph 325 is a rectangle function. Finally, in FIG. 3C, graph 330 is function obtained by multiplying Gaussian function 320 by rectangle function 325.

Figure 4:
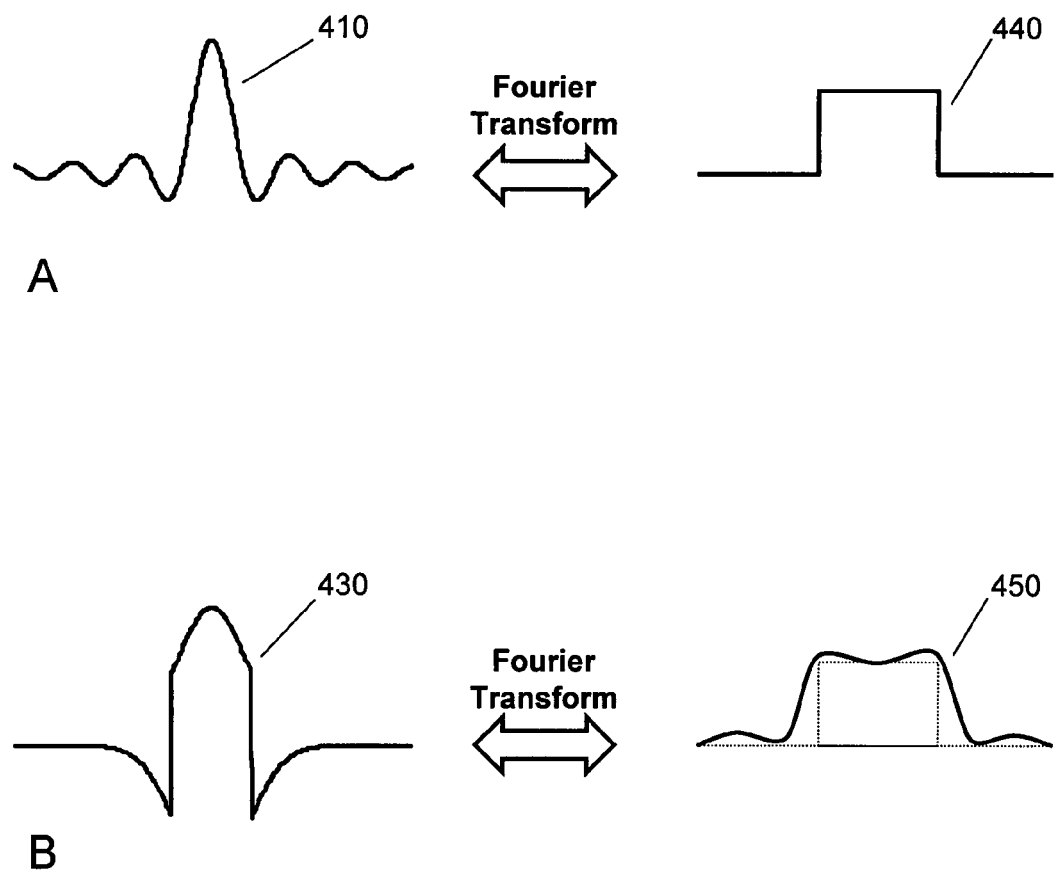
FIGS. 4 A and B show Fourier transform relationships between various functions.

FIGS. 4 A and B show Fourier transform relationships between various functions. In FIG. 4A, graph 410 is a sinc(x)

function while graph 440 is a rectangle function. In FIG. 4B, graph 430 is an approximation to a sinc(x) function while graph 450 is an approximation to a rectangle function.

FIG. 4A shows that the Fourier transform of a sinc(x) function is a rectangle function. FIG. 4B shows that the Fourier transform of a function that approximates a sinc(x) function is approximately a rectangle function. Approximate rectangle function 450, while not exactly the same as rectangle function 440, is a better approximation to a rectangle function than a Gaussian function is.

In FIG. 3B graph 320 represents the electric field profile of a Gaussian light beam. Graph 325, on the other hand, represents the phase imparted by a phase plate. Both graphs are plotted with the same horizontal scale. The phase has a first fixed value near the center of the Gaussian beam profile and a second fixed value elsewhere. If electric field profile 320 is phase shifted according to phase shift 325, then the resulting electric field profile has the form of graph 330 in FIG. 3C. FIG. 4B illustrates that the Fourier transform of an approximate sinc(x) function such as 330 or 430 is an approximate rectangle function 450. The width and height of the rectangular step size in function 325 determine the shape of function 330/430 and therefore 450 as well. These mathematical concepts may now be applied to the array illumination system illustrated in FIG. 2.

Figure 5A:
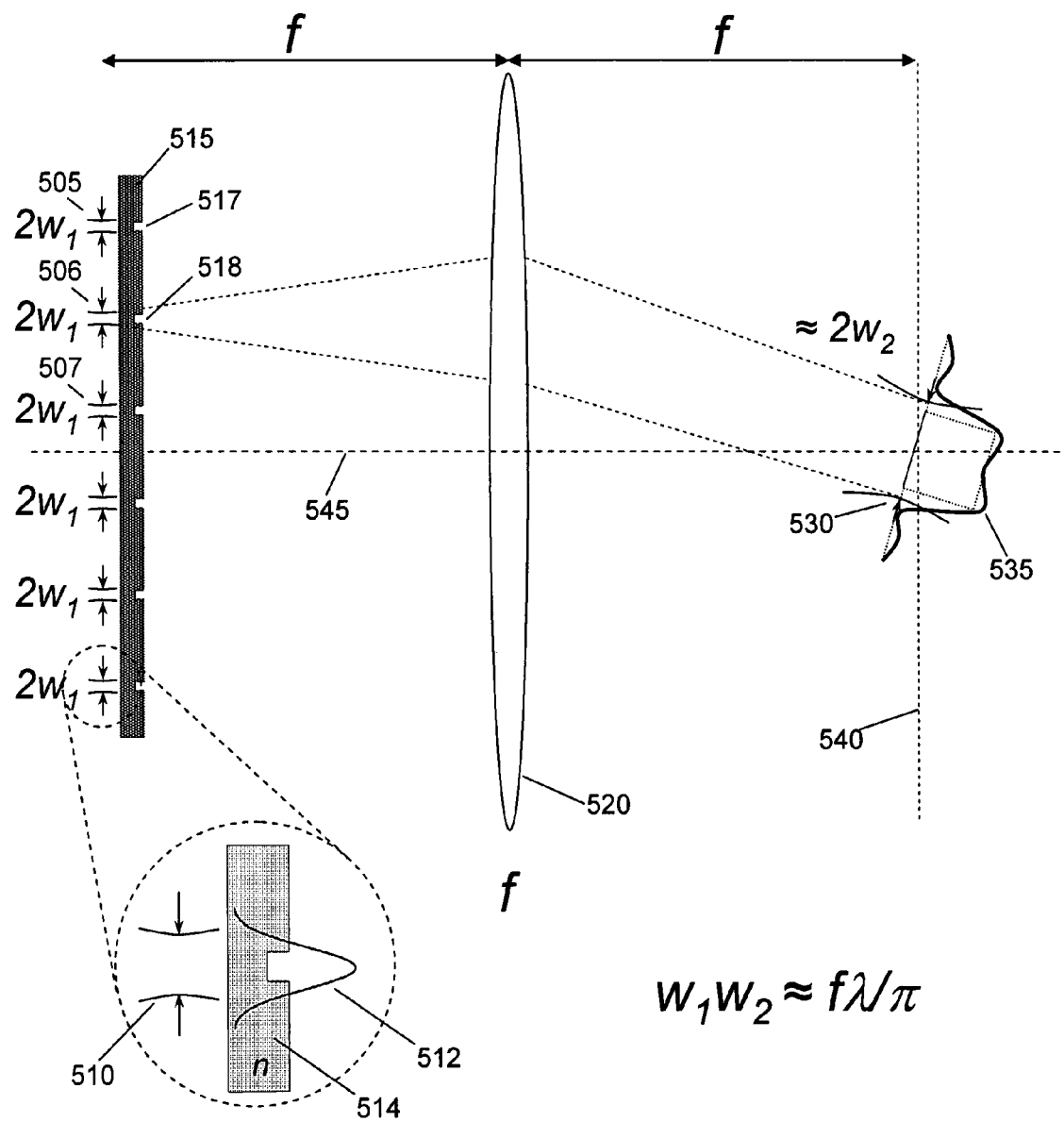
FIGS. 5 A, B and C shows how light from lasers in an array may be modified by a phase plate and focused by a lens or lenses.

FIG. 5A shows how light from lasers in an array may be modified by a phase plate and focused by a lens. In FIG. 5A beam waists of six lasers are shown schematically as 505, 506, 507, etc. An enlarged view shows the waist 510 of a laser as well as its Gaussian intensity profile 512. A section of phase plate 515 is shown enlarged as phase plate 514.

As in FIGS. 1 and 2, the $1/e^2$ waist diameter of each light beam is equal to $2w_1$. Lens 520 is placed one focal length, f, away from the plane containing the beam waists of the lasers. Light from each laser is focused at a distance, f, away from lens 520 on the opposite side of the lens from the laser. The light is focused at focal plane 540 in the figure.

Lens 520 causes the Fourier transform of the distribution of light at the laser beam waists to appear at focal plane 540. Phase plate 515 is made of glass or another transparent material characterized by an index of refraction, n. Notches, such as 517 and 518 (and also illustrated in enlarged section 514), affect the phase of light passing through the phase plate. Laser waists 505, 506, 507, etc. have Gaussian profiles that are centered on the notches in the phase plate. The width of the Gaussian beams and the width of notches in the phase plate are similar, but not necessarily equal. The width of the notches may be between approximately 0.25 times the beam diameter and approximately 2 times the beam diameter. Different notch widths lead to different phase shifts and therefore different beam profiles in the Fourier plane.

When a Gaussian beam passes through a phase plate at a notch the electric field profile of the beam is modified in the same way that electric field profile 320 is modified by phase function 325. The electric field profile of the beam after passing through the phase plate has the form of electric field profile 330. Lens 520 causes the Fourier transform of this profile to appear at focal plane 540. The Fourier transform relationship is that illustrated in FIG. 4B. Therefore the light intensity profile at focal plane 540 has the approximately rectangular form 535.

Light at focal plane 540 has an approximately rectangular profile with beam width 530 approximately equal to $2w_2$. The waists of light beams at the lasers and the focal plane are related approximately by: $w_1 w_2 \approx f\lambda/\pi$. When $w_2 >> w_1$, the beam at focal plane 540 is nearly collimated.

Figure 5B:
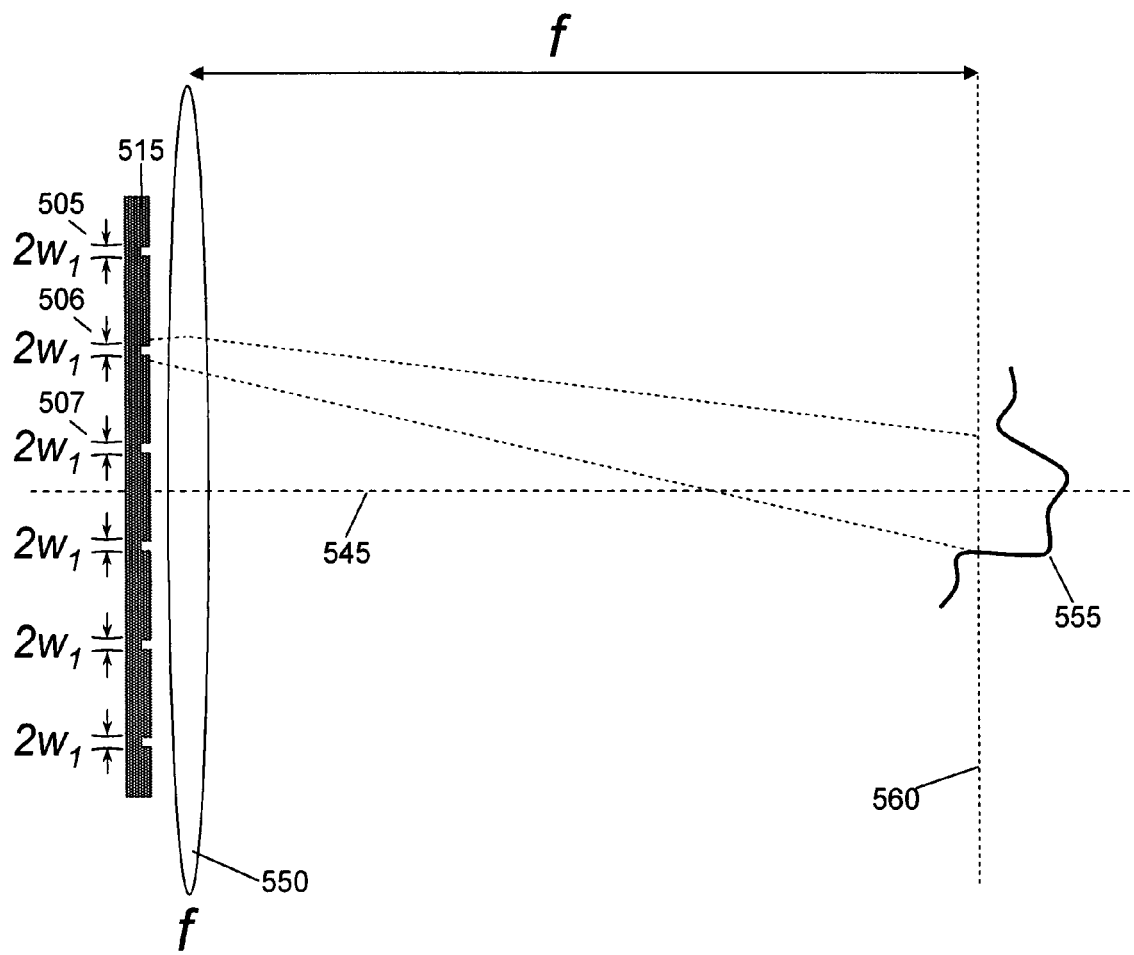

FIG. 5B shows how light from lasers in an array may be modified by a phase plate and focused by a lens in an alternative arrangement to that illustrated in FIG. 5A. Reference numbers in FIG. 5B refer to the same elements as in FIG. 5A. In FIG. 5B, however, the focal length of lens 550, while still denoted by "f", need not be the same as the focal length of lens 520. A distance "f" shown in any particular figure represents the focal length of a lens or lenses labeled "f" in that figure. The distance from phase plate 515 to reference plane 560 in FIG. 5B need not be the same as the distance from phase plate 515 to reference plane 540 in FIG. 5A. Lens 550 is placed as close as practical to waists 505, 506, 507, etc. The lens cannot be placed at the waists because of the finite thickness of intervening phase plate 515.

The intensity profile 555 at focal plane 560 resulting from light originating at waist 506 has an approximately rectangular form. This effect is obtained because lens 550 causes the Fourier transform of the electric field profile at the lens to appear at focal plane 560. After passing through phase plate 515, light originating at waist 506, has the form of electric field profile 330. As explained earlier, this leads to an approximately rectangular profile at the Fourier plane.

In the arrangement of FIG. 5B, the total intensity profile at plane 560 is the sum of intensities of light originating from the lasers in an array. Light originating from waists (e.g. waists 505, 506, 507) that are not coincident with axis 545 arrives at plane 560 in waves that are tilted with respect to plane 560. These tilts can be corrected by the introduction of a second lens.

Figure 5C:
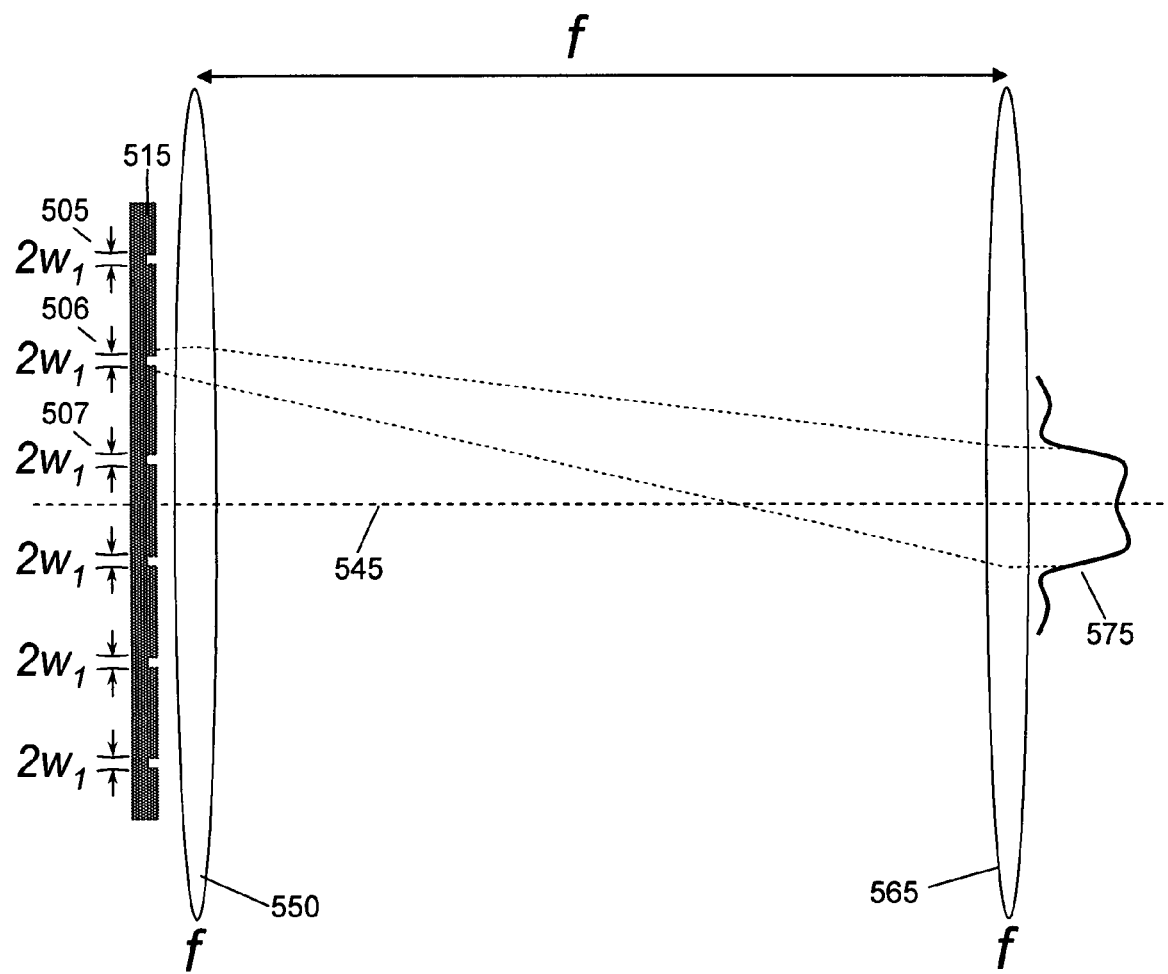

FIG. 5C shows how light from lasers in an array may be modified by a phase plate and focused by two lenses in an alternative arrangement to that illustrated in FIGS. 5A and 5B. In FIG. 5C lens 565 is placed one focal length away from lens 550; said another way, in FIG. 5C lens 565 has been placed in plane 560 of FIG. 5B. Lens 565 adjusts the tilts of light beams originating from the various waists in an array so that intensity profile 575 is produced. Intensity profile 575 is a sum of profiles similar to profile 555, each of which is corrected to propagate parallel to axis 545 by lens 565. Note that if the focal length of lens 550 in FIG. 5C were extended to infinity, the arrangement of FIG. 5C would become equivalent to that of FIG. 5A.

Figure 6A:
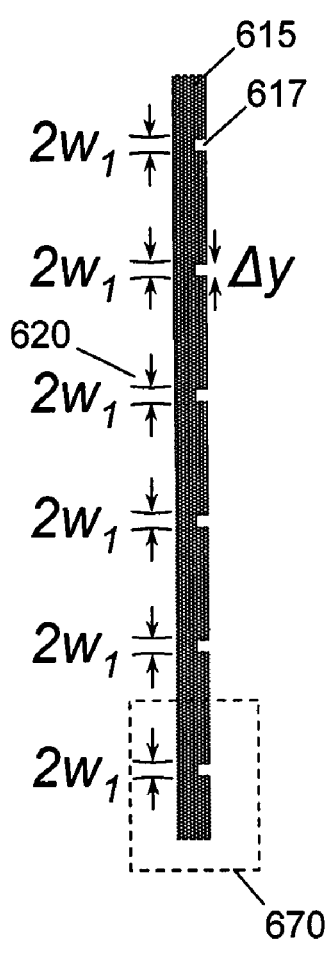
FIGS. 6 A, B, C, D and E show views of phase plates and various types of notches therein.
Figure 6B:
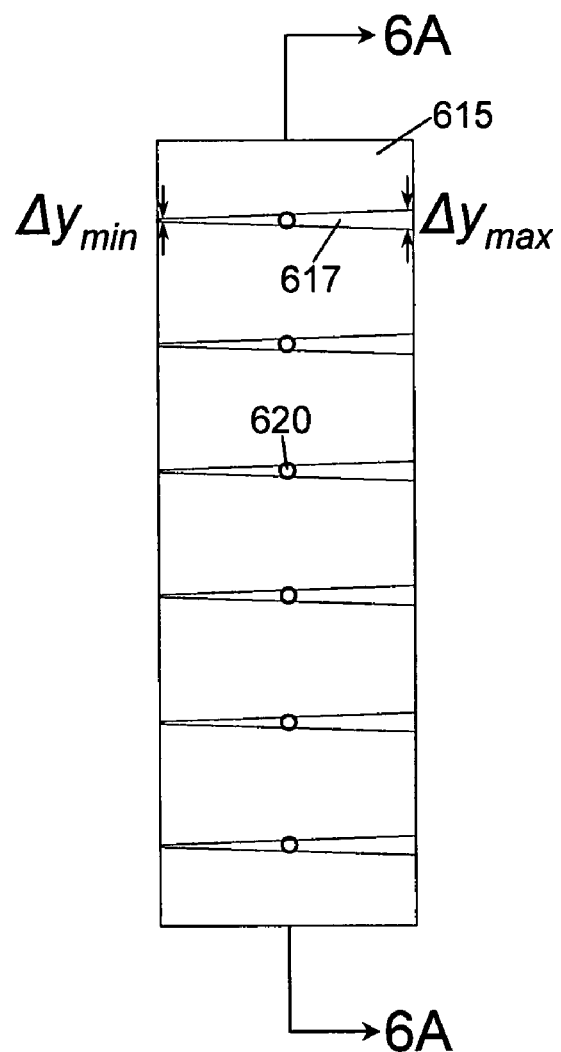
Figure 6C:
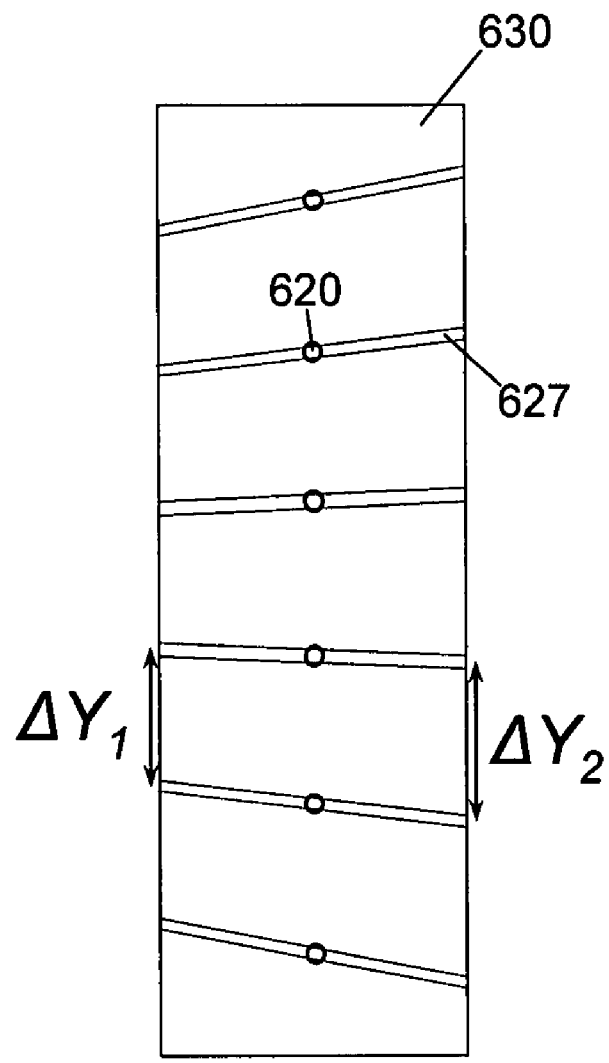
Figure 6D:
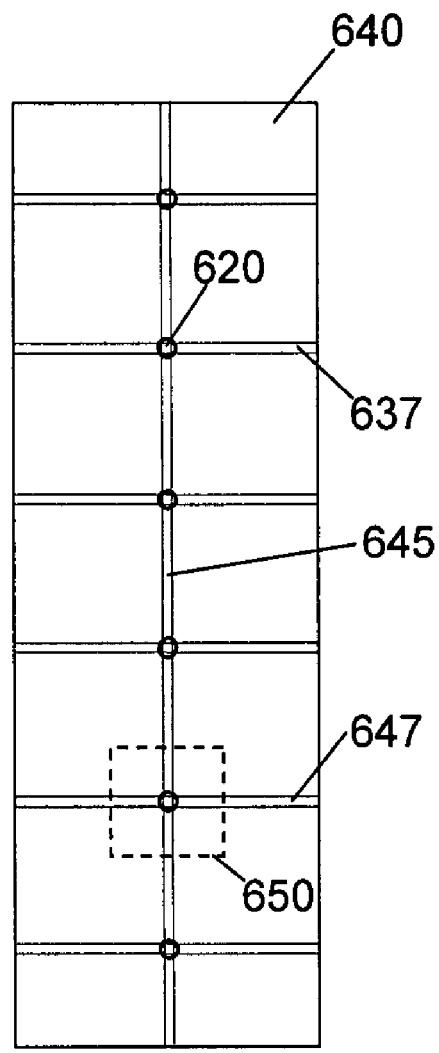
Figure 6E:
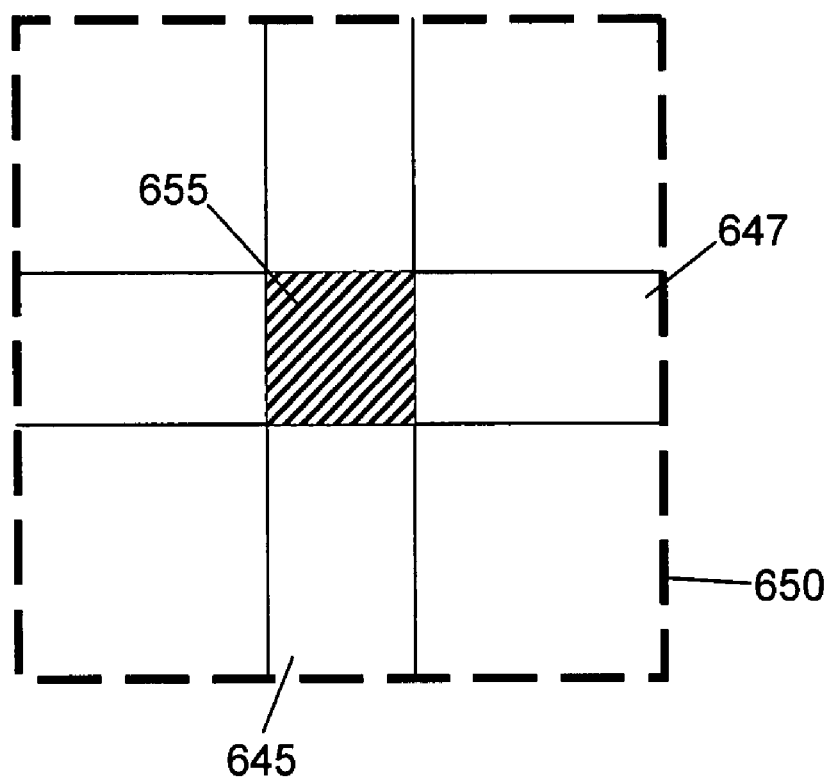

Phase plate 515 may be designed to provide ways of tuning the effect of notches in it. The first of these, illustrated in FIGS. 6A and 6B, tunes the width of the notches. This is equivalent to changing the width of a rectangle phase function such as function 325. FIGS. 6A and 6B show views of a phase plate with variable width notches. FIG. 6C illustrates a phase plate with notches that are slanted such that the spacing between notches varies from one side of the plate to the other. FIG. 6D illustrates a phase plate similar to that of FIGS. 6A-6C, but with an additional notch perpendicular to the notches shown in FIGS. 6A-6C. FIG. 6E shows an enlarged view of the intersection of two notches in FIG. 6D.

In FIG. 6, phase plates 615, 630, 640 are made of glass or other transparent material characterized by an index of refraction, n. FIG. 6A is a side view of phase plate 615 while FIG. 6B is a front view; i.e. FIG. 6B is a view of the structure shown in FIG. 6A from a perspective lying in the plane of FIG. 6A. The phase plate has notches such as notch 617. The width of a notch in the phase plate is denoted by Δy. 620 is the waist of a light beam, for example the light beam from a laser.

In FIG. 6B it is apparent that the width of notches in phase plate 615 varies from $\Delta y_{min}$ at one edge of the plate to $\Delta y_{max}$ at the opposite edge. The width of a notch affecting a Gaussian laser beam passing through the phase plate may therefore be adjusted by moving the phase plate with respect to the Gaussian beam. Specifically, phase plate 615 may be translated in the plane of FIG. 6B and parallel to the axis of the notches in the plate.

FIG. 6C shows a view of a phase plate 630 that is similar to phase plate 615. In FIG. 6C, however, notches, such as notch 627, are slanted. The spacing of notches on one side of the plate is $\Delta Y_1$; on the other side of the plate the spacing is increased to $\Delta Y_2$. A phase plate with variable notch spacing is useful when the spacing between lasers in an array is not known exactly prior to assembly of a package containing a laser array and phase plate. Translation of the phase plate in a direction roughly parallel to the long dimension of notches in the plate allows the spacing of lasers and the spacing of notches to be precisely matched.

FIG. 6D illustrates a phase plate similar to that of FIGS. 6A-6C, but with an additional notch perpendicular to the notches shown in FIGS. 6A-6C. FIG. 6D shows a view of a phase plate 640 that is similar to phase plates 615 and 630. In FIG. 6D, however, in addition to notches such as notches 637 and 647, a perpendicular notch 645 is included. Dotted outline 650 denotes the extent of the magnified view shown in FIG. 6E.

A phase plate containing notches all oriented in one direction, or nearly so, as illustrated in FIG. 6A-6C, may be used with an array of laser beams to produce a combined beam intensity profile that is rectangular in one dimension and Gaussian in the perpendicular dimension. However, a beam intensity profile that is rectangular in both transverse dimensions may be obtained by including a perpendicular notch, such as notch 645, in the phase plate. The perpendicular notch provides a phase shift on beams in a laser array and leads to a transformed intensity profile as discussed in connection with FIGS. 3-5.

FIG. 6E shows a magnified view of the intersection of notches 645 and 647. The region of overlap of these two notches is marked as area 655. The depth of region 655, i.e. the depth of material removed from the phase plate, is equal to the sum of the depths of notches 645 and 647. The phase shift imparted to a beam passing through the phase plate in area 655 is the sum of the phase shifts that would result from passing through notch 645 or 647 alone. Note that notches 645 and 647 need not have the same width or the same depth.

Figure 7:
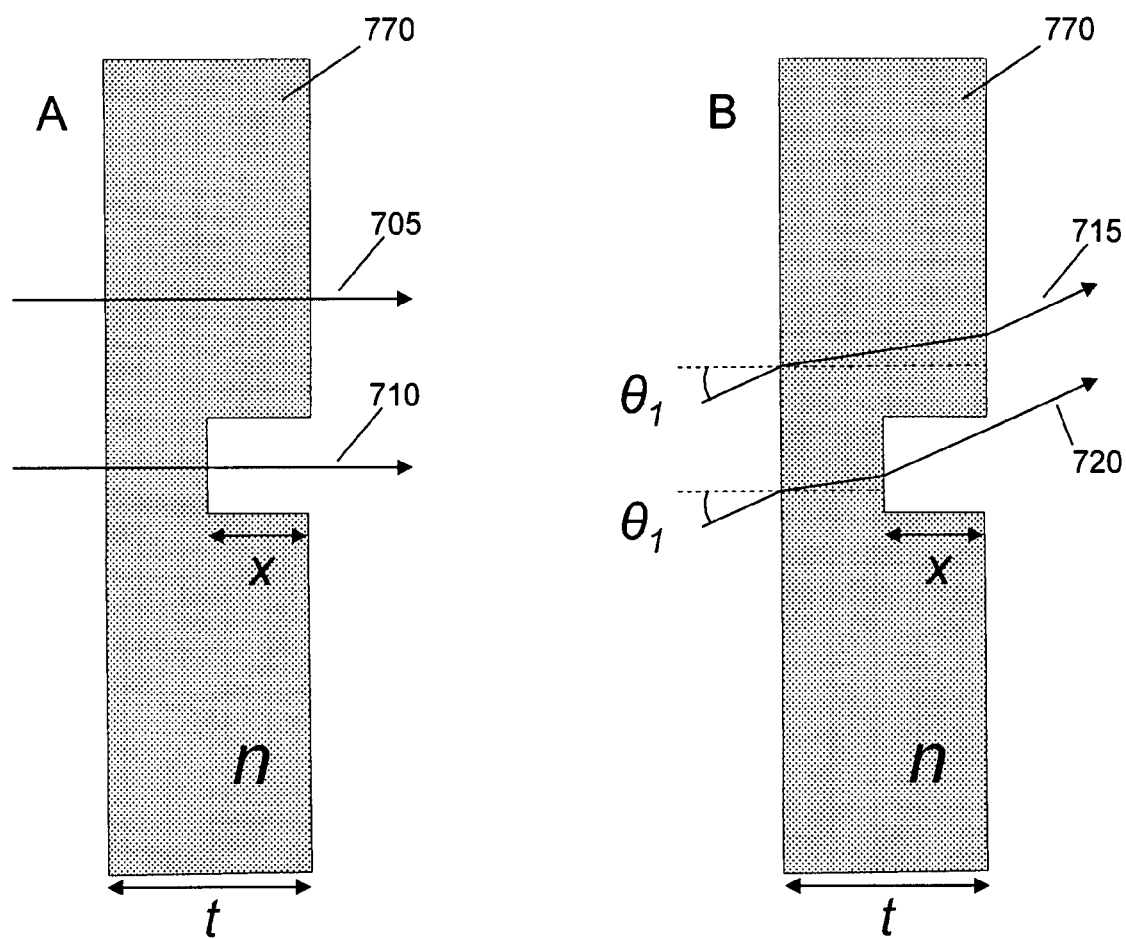
FIGS. 7 A and B illustrate light rays propagating at various angles through a section of a phase plate.

Another way of tuning the notches in the phase plate, illustrated in FIGS. 7A and B, adjusts, in effect, their depth. In FIGS. 7A and B, a section 670 of phase plate 615 is enlarged as phase plate 770. The phase plate is transparent and has an index of refraction, n. The thickness, t, of the phase plate and the depth, x, of a notch in it are marked in the figure. Also shown in FIG. 7A are light rays 705 and 710 which traverse the phase plate normal to its surface. In FIG. 7B light rays 715 and 720 arrive at an angle $e_1$ with respect to the normal to the phase plate surface.

In FIG. 7A the difference in phase accumulated by rays 705 and 710 as they pass through phase plate 770 is equal to $kx(n-1)$ where $k=2\pi/\lambda$ and $\lambda$ is the wavelength of the light. Distance x is marked in the figure and n is the index of refraction of the phase plate. In FIG. 7B phase plate 770 has been tilted with respect to light rays 715 and 720 by an angle $\theta_1$. The difference in phase accumulated by rays 715 and 720 as they pass through plate 770 is equal to $$\frac{kxn}{\cos\theta_2} - \frac{kx}{\cos\theta_1} kxn(\sin\theta_1)(\tan\theta_1 - \tan\theta_2)$$

where $\theta_2$ is related to $\theta_1$ by $\sin\theta_1 = n \sin\theta_2$. The phase difference increases as $\theta_2$ increases. This is equivalent to changing the height of phase function 325 in FIG. 3B.

Notches in a phase plate can be effectively tuned in depth by tilting the plate. Tuning by tilting can also be used with phase plates comprising the variable width notches of FIGS. 6A and 6B, the slanted notches of FIG. 6C, or the perpendicular notch of FIGS. 6D and 6E.

Figure 8:
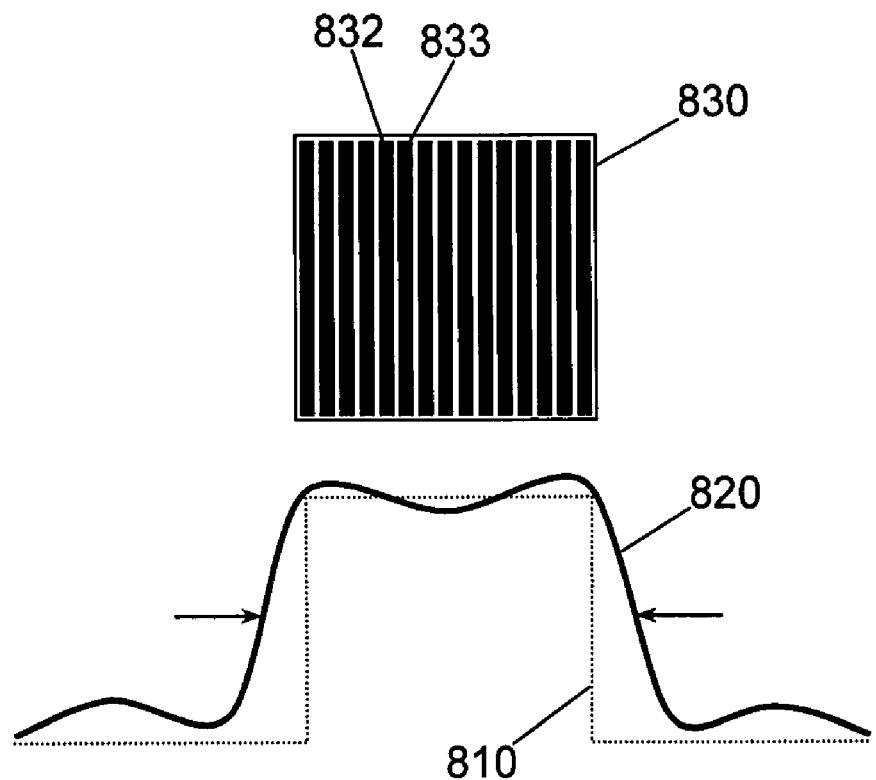
FIG. 8 illustrates the intensity profile of a light beam that is matched to elements in a MEMS light modulator.

FIG. 8 illustrates the intensity profile of a light beam that is matched to elements in a MEMS light modulator. Intensity profile 820 is superimposed on the profile 810 of a rectangle function for comparison. MEMS light modulator 830 contains ribbon structures such as 832 and 833. Ideally all ribbon structures in light modulator 830 are illuminated with the same light intensity as would be the case if they were illuminated by a light beam with a rectangular profile such as 810. Intensity profile 820 is an approximation to the rectangular profile. Profile 820 is the result of combining light from lasers in an array as illustrated in FIGS. 5A-5C.

One way to define the efficiency of the system of FIGS. 5A-5C is the fraction of the area under profile 820 that also falls under profile 810 in FIG. 8. Suitable choices of phase plate index and notch dimensions result in efficiency greater than 60%.

Figure 9:
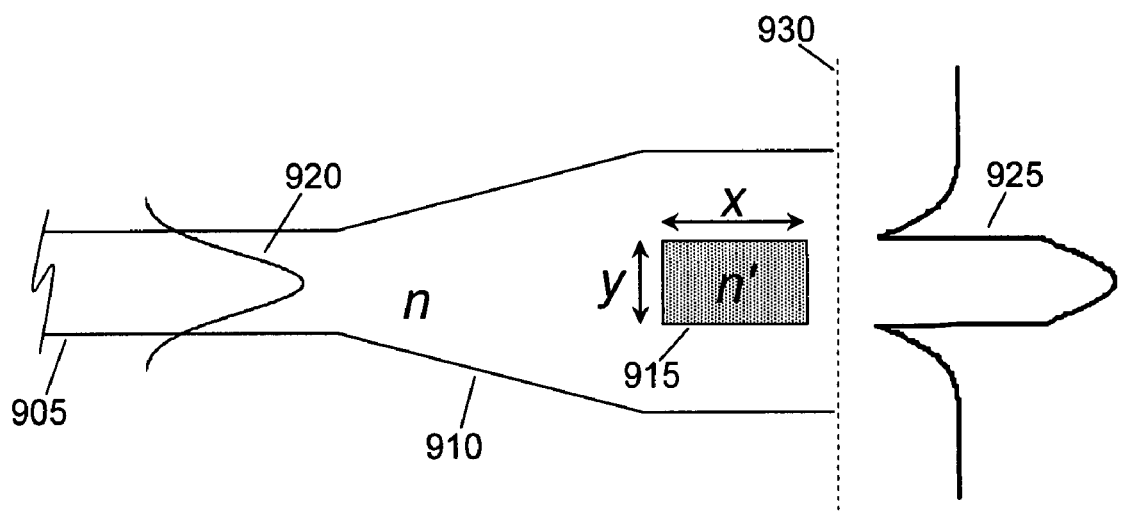
FIG. 9 shows a section of a tapered waveguide with a phase adjusting block.

The enlarged section 514 in FIG. 5A shows the waist of a freely propagating Gaussian beam interacting with a bulk notched phase plate. The same effect can also be obtained in a waveguide optical system. FIG. 9 shows a section of an adiabatically tapered waveguide with a phase adjusting block. In FIG. 9 waveguide 905 includes a tapered section 910 with a phase adjusting block 915. The index of refraction in the waveguide is n. The phase adjusting block is a region of waveguide 905 with either a higher or lower index of refraction, n', than the rest of the guide. A confined optical mode in the waveguide, such as mode 920, expands in adiabatically tapered section 910 before arriving at phase adjusting block 915. Because block 915 presents a different index of refraction to the center of the optical mode, that part of the mode is phase shifted. Mode 925 is an example of an optical mode that may be obtained at output plane 930 by appropriate choices of n and n', and block dimensions x and y. The dimensions x and y of the block are analogous to dimensions x and $\Delta y$ of the notches shown in FIGS. 7A and 7B, and 6A and 6B, respectively. One way the waveguide may be realized is as a silica ridge waveguide. An array of waveguides may be coupled to a laser array in analogy to the coupling of a bulk phase plate with multiple notches to a laser array.

Optical mode profile 925 may be Fourier transformed by a lens in analogy to the system illustrated in FIGS. 5A-5C thereby creating illumination profiles of approximately rectangular shape. An array of waveguide systems of the type illustrated in FIG. 9 may be particularly useful when an array of light sources is coupled to an array of fiber optic cables or an array of integrated waveguides. In these systems an array of waveguides replaces the phase plate of FIGS. 5A-5C.

The phase plates and integrated phase adjusting blocks described here provide ways to efficiently use the light emitted by lasers, for example diode laser arrays, to uniformly illuminate linear light modulator arrays. These systems could be extended by using phase plates with more complicated structures. The notched phase plate could be replaced by a plate with rectangular ridges instead of notches. Furthermore more complex phase adjustments may be made with more complex phase functions than the rectangular phase functions described here. For example Bessel phase functions applied to a Gaussian beam will result in beam profiles more closely approximating a sinc function.

The laser arrays described herein need not comprise diode lasers. For example, optically pumped lasers could be used instead.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. An illumination system comprising:
   an array of lasers that emit light beams having Gaussian profiles;
   a phase plate having an array of notches centered on the light beams such that the phase plate imparts a rectangular phase shift on the profile of each light beam; and,
   a lens that combines the phase shifted light beams into a combined light beam having a profile that is a Fourier transform of the phase shifted profiles.

2. The system of claim 1 wherein the lasers are diode lasers.

3. The system of claim 2 wherein the diode lasers are extended vertical cavity, surface emitting, diode lasers.

4. The system of claim 1 wherein the lasers are optically pumped lasers.

5. The system of claim 1 wherein the profile of the combined light beam is approximately rectangular.

6. The system of claim 1 wherein the phase plate is made of glass.

7. The system of claim 1 wherein the width of the notches varies from a minimum dimension at one edge of the plate to a maximum dimension at the opposite edge.

8. The system of claim 7 wherein the minimum width of the notches is approximately 0.25 times the light beams' waists' diameters and the maximum width of the notches is approximately 2 times the light beams' waists' diameters.

9. The system of claim 7 wherein the spacing between notches varies from a minimum dimension at one edge of the plate to a maximum dimension at the opposite edge.

10. The system of claim 7 wherein one notch is oriented perpendicular to the others.

11. The system of claim 1 wherein the phase plate is tilted such that the light beams arrive at the phase plate at an angle with respect to the normal of a phase plate surface.

12. The system of claim 1 wherein the phase plate comprises ridges.

13. The system of claim 1 wherein the lens is placed one focal length away from the beam waists of the lasers.

14. The system of claim 1 wherein the lens is placed as close as practical to the beam waists of the lasers.

15. The system of claim 14 further comprising a second lens, having a focal length equal to that of the first lens, placed in the focal plane of the first lens.

16. An illumination system comprising:
    an array of lasers that emit light beams having Gaussian profiles;
    an array of adiabatically tapered optical waveguides coupled to the laser array wherein each waveguide incorporates a phase adjusting block that imparts a phase shift on the profile of the waveguide optical mode; and,
    a lens that combines the output of the waveguides into a combined light beam having a profile that is a Fourier transform of the phase shifted profiles.

17. The system of claim 16 wherein the lasers are diode lasers.

18. The system of claim 17 wherein the diode lasers are extended vertical cavity, surface emitting, diode lasers.

19. The system of claim 16 wherein the profile of the combined light beam is approximately rectangular.

20. The system of claim 16 wherein the waveguides are silica ridge waveguides.

21. The system of claim 16 wherein the lens is placed one focal length away from the output of the waveguides.

22. The system of claim 16 wherein the lens is placed at the output of the waveguides.

23. The system of claim 22 further comprising a second lens, having a focal length equal to that of the first lens, placed in the focal plane of the first lens.

* * * * *